United States Patent
Nassif

[19]

[11] Patent Number: 5,963,043
[45] Date of Patent: Oct. 5, 1999

[54] METHOD AND APPARATUS FOR CHARACTERIZED PARASITIC CAPACITANCE BETWEEN INTEGRATED-CIRCUIT INTERCONNECTS

[75] Inventor: Sani Richard Nassif, Austin, Tex.

[73] Assignee: International Business Machines Corporation, Armonk, N.Y.

[21] Appl. No.: 08/931,956

[22] Filed: Sep. 17, 1997

[51] Int. Cl.[6] .................................................. G01R 27/26
[52] U.S. Cl. ........................................ 324/681; 324/676
[58] Field of Search ................. 324/676, 678, 324/681, 687, 688; 377/19, 24

[56] References Cited

U.S. PATENT DOCUMENTS

| | | | |
|---|---|---|---|
| 4,173,736 | 11/1979 | Adams | 324/538 |
| 4,339,709 | 7/1982 | Brihier | 324/681 |
| 4,429,271 | 1/1984 | Doubek et al. | 324/678 |
| 4,661,768 | 4/1987 | Carusillo | 324/678 |
| 5,202,640 | 4/1993 | Schaaf et al. | 324/537 |
| 5,274,334 | 12/1993 | Mills | 324/678 |
| 5,357,191 | 10/1994 | Grace | 324/754 |
| 5,430,383 | 7/1995 | Boos | 324/642 |
| 5,461,321 | 10/1995 | Sanders et al. | 324/678 |
| 5,576,628 | 11/1996 | Caliboso et al. | 324/678 |
| 5,777,482 | 7/1998 | Tielert et al. | 324/678 |

OTHER PUBLICATIONS

IEEE Transactions on Election Devices, vol. Ed–30, No. 2, Feb. 1983, "Simple Formulas for Two– and Three–Dimensional Capacitances," T. Sakurai and K. Tamaru.

*Primary Examiner*—Diep Do
*Attorney, Agent, or Firm*—Casimer K. Salys; Antony P. Ng; Andrew J. Dillon

[57] ABSTRACT

A method and apparatus for characterizing dimensions and parasitic capacitance between integrated-circuit interconnects are disclosed. The apparatus is a test structure including at least two substantially identical oscillators, at least two substantially identical counters, and a pulse generator. Each of the oscillators is connected to an integrated-circuit interconnect. Each of the counters is coupled to a respective oscillator. The pulse generator is utilized to inject a series of fixed-length clock pulses to each of the oscillators such that the parasitic capacitance of the integrated-circuit interconnects can be characterized by the ratio of oscillation periods of the oscillators to parasitic capacitances of the integrated-circuits.

11 Claims, 4 Drawing Sheets

METHOD AND APPARATUS FOR CHARACTERIZED PARASITIC CAPACITANCE BETWEEN INTEGRATED-CIRCUIT INTERCONNECTS

BACKGROUND OF THE INVENTION

1. Technical Field

The present invention relates to a method and apparatus for characterizing integrated-circuits (ICs) in general, and in particular to a method and apparatus for characterizing IC interconnects. Still more particularly, the present invention relates to a method and apparatus for characterizing dimensions and parasitic capacitance between IC interconnects.

2. Description of the Prior Art

During the course of designing a very large-scale integrated (VLSI) circuit, it is desirable to render some form of circuit characterization in order to determine the performance of the circuit. The characteristic of a VLSI circuit is generally dependent upon two major factors, namely, parasitic capacitance and parasitic resistance.

For a VLSI circuit, signal delays are generally the sum of device (such as transistor) delays and wire delays. Wire delays are typically attributed by the parasitic capacitance associated with the interconnect materials within the VLSI circuit. Accordingly, it is important that the characteristics of the interconnect parasitic capacitances be well understood and controlled. Along the same vein, it is imperative to characterize all interconnect parasitic capacitances within a VLSI circuit in order to determine whether or not they exceed certain design criteria.

Interconnect parasitic capacitance characterization may be performed before and after the actual fabrication of a VLSI circuit. Before fabrication, characterization is performed via device modelling and circuit simulations. After the VLSI circuit has been fabricated, characterization may be performed by direct measurement. In practice, however, interconnect characterization via direct measurement is very difficult because the magnitude of the parasitic quantities, such as resistance, capacitance and inductance, is very small. Consequently, it would be desirable to provide an improved method and system for characterizing dimensions as well as parasitic capacitance between IC interconnects without utilizing direct measurement.

SUMMARY OF THE INVENTION

In view of the foregoing, it is therefore an object of the present invention to provide an improved method and s apparatus for characterizing integrated-circuits (IC).

It is another object of the present invention to provide an improved method and apparatus for characterizing IC interconnects.

It is yet another object of the present invention to provide an improved method and apparatus for characterizing dimensions and parasitic capacitance between IC interconnects.

In accordance with a preferred embodiment of the present invention, a test structure is provided which includes at least two identical oscillators, at least two identical counters, and a pulse generator. Each of the oscillators is connected to an integrated-circuit interconnect. Each of the counters is coupled to a respective oscillator. The pulse generator is then utilized to inject a series of fixed-length clock pulses to each of the oscillators such that the parasitic capacitance of the integrated-circuit interconnects can be characterized by the ratio of oscillation periods of the oscillators to parasitic capacitances of the integrated-circuits.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
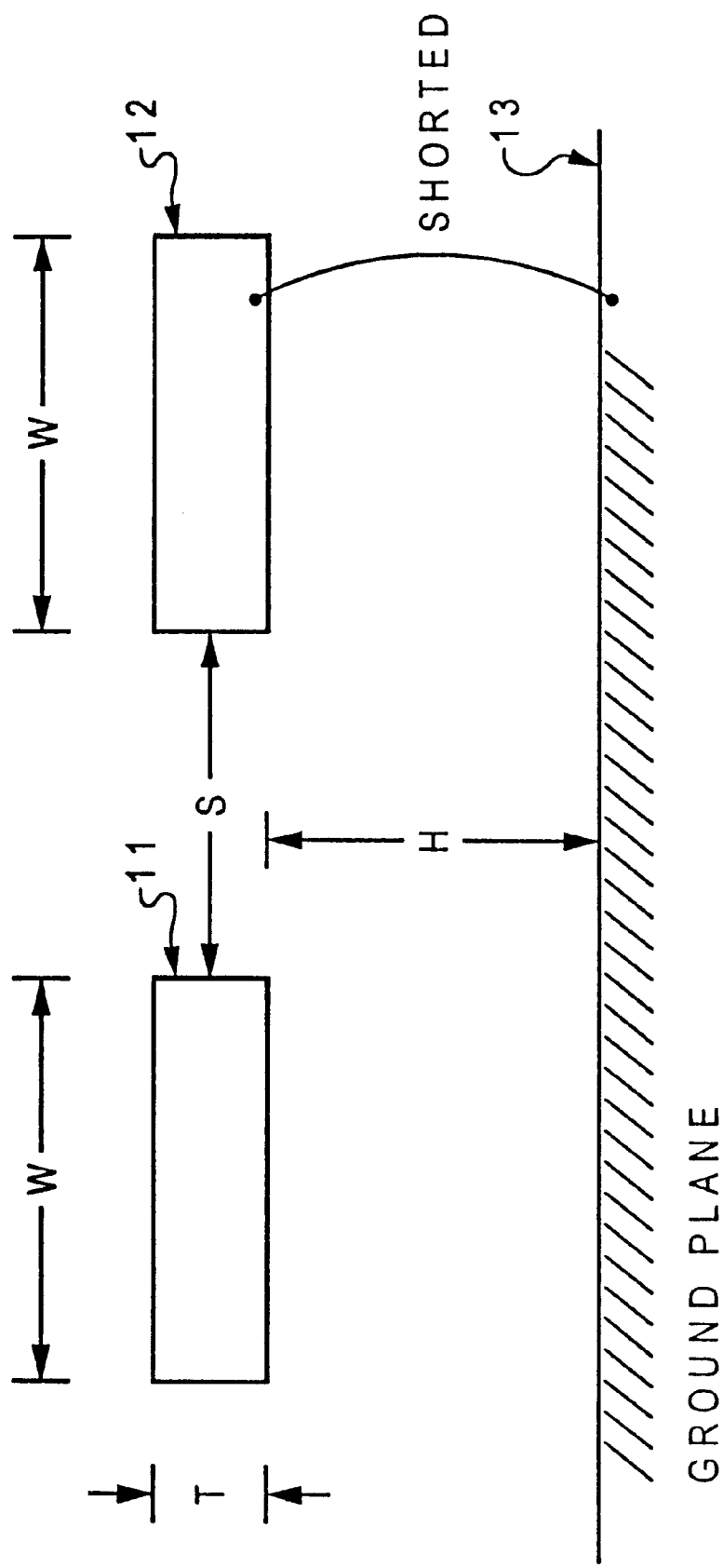
FIG. 1 is a cross-sectional diagram of three interconnects within an integrated-circuit.

Referring now to the drawings and in particular to FIG. 1, there is depicted a cross-sectional diagram of three interconnects within an integrated circuit. As shown, an interconnect 11, having a width W and a thickness T, is located at a horizontal distance S from an interconnect 12, having a width W and a thickness T. Interconnects 11 and 12 are also located at a vertical distance H from an interconnect 13. For the sake of simplicity, interconnect 13 may be viewed as a ground plane. Furthermore, interconnect 12 is shown to be connected to interconnect 13 for the purpose of characterizing distance S, as will be explained infra.

THEORY

In order to characterize parasitic capacitance between interconnects 11 and 12, thickness T and distance H need to be determined. In a paper titled "Simple Formulas for Two- and Three-Dimensional Capacitances," by Sakurai and Tamaru in *IEEE Transactions on Electron Devices*, vol. ED-30, No.2, February 1983, capacitance C per unit length of a single line place on a bulk silicon is given by $$C = 1.15\left(\frac{W}{H}\right) + 2.8\left(\frac{T}{H}\right)^{0.222} \tag{1}$$

where W is the width of the line, T is the thickness of the line, and H is the distance between the line and the bulk silicon.

On the other hand, capacitance $C_L$ of a single line can be calculated by utilizing the following formula:

$$C_L = C_{area}WL + 2C_{perm}(W+L) \tag{2}$$

where W is the width of the line, L is the length of the line, $C_{area}$ is cross-sectional area of the line, and $C_{perm}$ is the perimeter of the line. By dividing $C_L$ by the length of line L, equation (2) becomes $$C = C_{area}W + 2C_{perm}\left(1 + \frac{W}{L}\right) \quad (3)$$

where C is the capacitance per unit length. When L>> W, equation (3) becomes $$C = C_{area}W + 2C_{perm} \quad (4)$$

By comparing equations (1) and (4), one will notice that $C_{area}$ is equal to 1.15/H and $C_{perm}$ is equal 1.4 $(T/H)^{0.222}$. Because $C_{area}$ and $C_{perm}$ can be accurately measured during fabrication process, thickness T and distance H can be found by utilizing the above mathematical relationships. With thickness T and distance H, capacitance per unit length C can be obtained via equation (1).

Additionally, after thickness T and distance H have been determined, distance S between interconnects 11 and 12 can also be found by utilizing the following formula $$C_T = 1.15\left(\frac{W}{H}\right) + 2.8\left(\frac{T}{H}\right)^{0.222} + \left[0.03\left(\frac{W}{H}\right) + 0.83\left(\frac{T}{H}\right) - 0.07\left(\frac{T}{H}\right)^{0.222}\right]\left(\frac{S}{H}\right)^{-1.34} \quad (5)$$

where $C_T$ is the total capacitance among interconnects 11, 12 and 13.

It is observed that when a CMOS ring-oscillator is externally loaded with a lumped capacitance $C_{lump}$, the oscillation period of the ring-oscillator exhibits a monotonic and nearly linear relationship with the lumped capacitance $C_{lump}$. Thus, in a circuit having two identical ring-oscillators, each ring-oscillator being loaded with a different capacitor, the ratio of oscillation periods is proportional to the ratio of the capacitance of the capacitors, as follows:

$$\frac{t_2}{t_1} \propto \frac{C_2}{C_1}$$

where t1 is the oscillation period for capacitance $C_1$ and t2 is the oscillation period for capacitance $C_2$.

PRINCIPLE OF OPERATIONS

The core idea of the present invention is to have three identical complimentary metal-oxide semiconductor (CMOS) ring-oscillators respectively loaded with (1) a reference capacitor preferably made of a MOSFET gate, (2) a first unknown capacitor C1 having an area A1 and a perimeter P1, and (3) a second unknown capacitor C2 having an area A2 and a perimeter P2. Capacitor C1 and capacitor C2 are interconnects composed of the same metal layer combination within an integrated-circuit. In addition, each of three CMOS ring-oscillators are individually connected to a multiple-bit counter. Each multiple-bit counter is then enabled to count for a fixed length of time, determined by a time-base generator that is designed for control and references.

According to the theory explained earlier, each of the three multiple-bit counters will then produce counts N0, N1 and N2, respectively. Because the count ratios are directly proportional to the capacitance ratios, thus the parasitic capacitances C1 and C2 of the interconnects can be calculated based on the capacitance of the well-characterized reference capacitor.

IMPLEMENTATION

Figure 2:
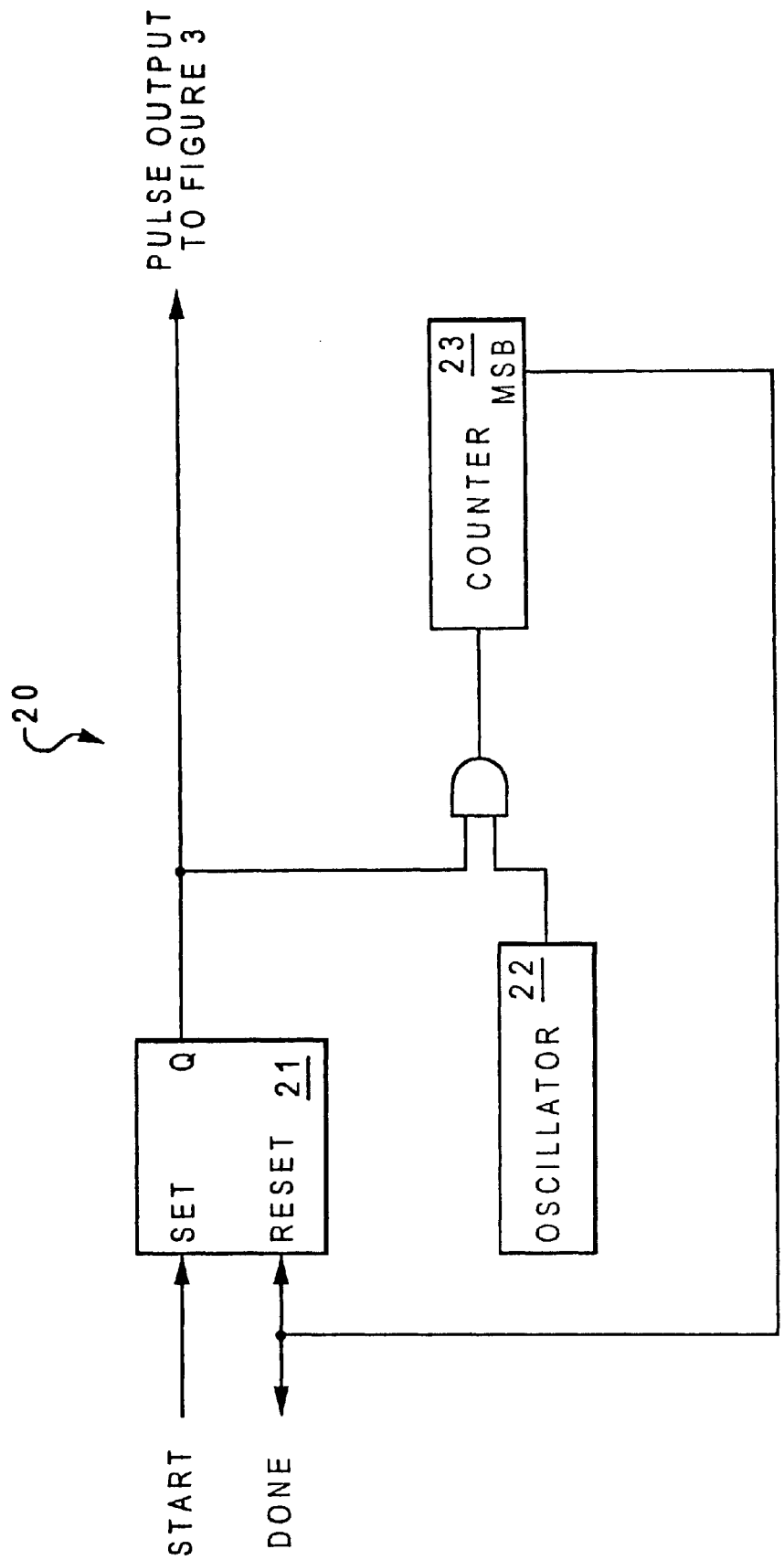
FIG. 2 is a block diagram of a time-based generator circuit for generating fixed-length pulses, in accordance with a preferred embodiment of the present invention.

With reference now to FIG. 2, there is illustrated a block diagram of a time-based generator circuit for generating fixed-length pulses, in accordance with a preferred embodiment of the present invention. As shown, time-based generator circuit 20 includes a flip-flop 21, an oscillator 22, and a binary counter 23. The output from flip-flop 21 and the output from oscillator 22 is coupled to the input of binary counter 23 via a two-input AND-gate. Binary counter 23 is utilized to count the number of oscillations over a fixed time interval. The counting can be started by an assertion of the SET input of flip-flop 21. The most significant bit (MSB) of binary counter 23 will reset flip-flop 21 when binary counter 23 becomes overflow. As such, clock pulses of a fixed time interval are generated from the output of flip-flop 21. These fixed-length pulses are sent to a test structure shown in FIG. 3.

Figure 3:
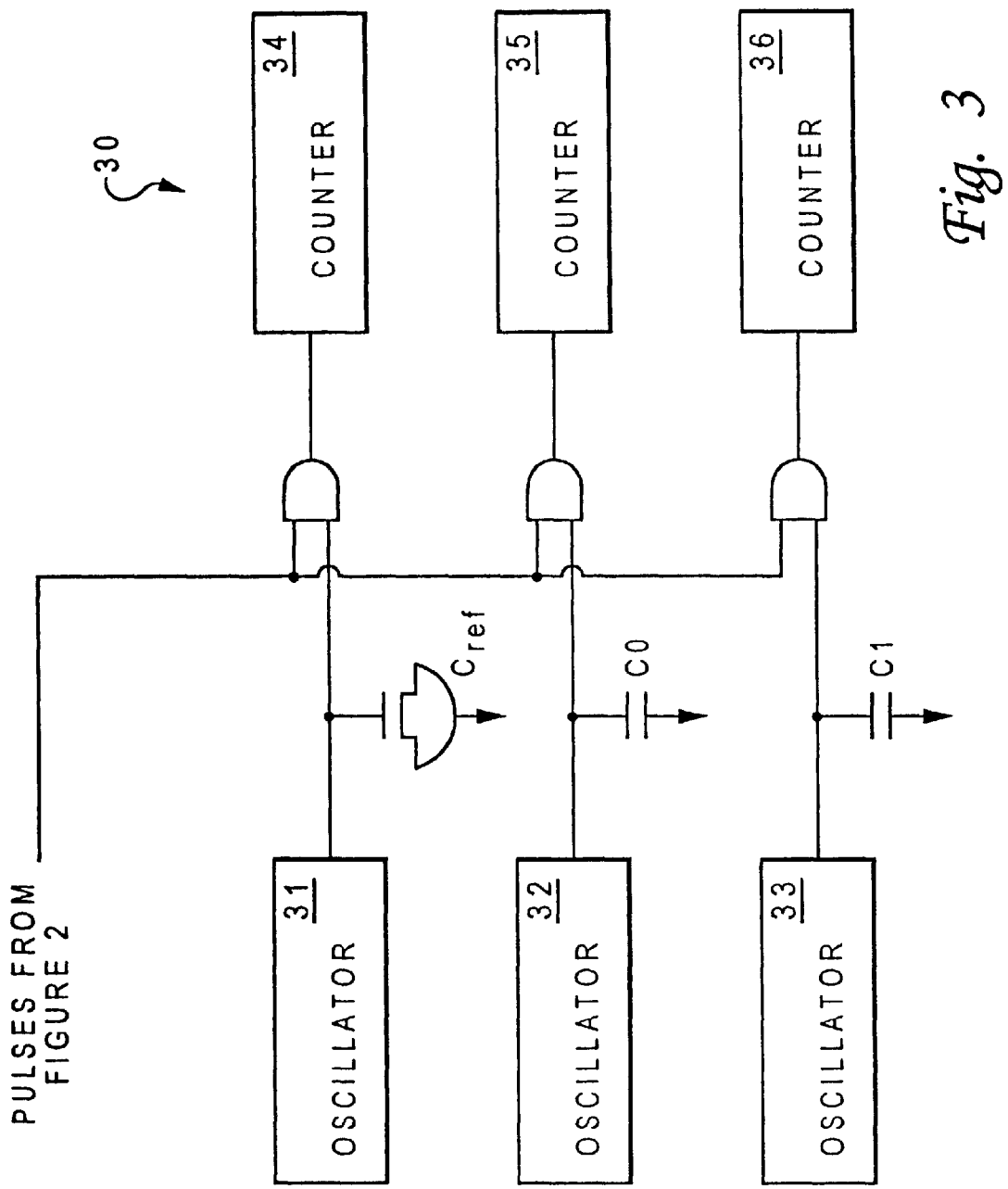
FIG. 3 is a test structure for characterizing dimensions and parasitic capacitance between integrated-circuit interconnects, according to a preferred embodiment of the present invention.

Referring now to FIG. 3, there is depicted a test structure for characterizing dimensions and parasitic capacitance between integrated-circuit interconnects, according to a preferred embodiment of the present invention. In addition to the time-based circuit of FIG. 2, test structure 30 includes oscillators 31–33 and counters 34–36. All three oscillators 31–33 are substantially identical in the sense that they are as nearly identical as process permits. Preferably, oscillators 31–33 are CMOS ring-oscillators made up by an odd number of invertors. Oscillator 31 is connected to a reference capacitor, preferably made of a MOSFET gate, having a known capacitance $C_{ref}$. Each of oscillators 32 and 33 is connected to an interconnect. The parasitic capacitance of these two interconnects are represented by C0 and C1. The output of each of oscillators 31–33 and the output pulses from the time-based generator circuit of FIG. 2 are respectively coupled to the input of each of counters 34–36 via a two-input AND-gate, respectively. Counters 34–36, also substantially identical to each other, are utilized to count the time period of the pulses generated by oscillators 31–33 respectively.

As an alternative embodiment, oscillators 31–33 can be consolidated into one single oscillator. With this embodiment however, additional care must be taken to insure that the path from the oscillator to each interconnect are approximately the same such that no extra delays are added due to discrepancy on the path distances.

Test structure 30 can be utilized to measure the ratio between parasitic capacitances C0 and C1. The measurement begins by sending a sequence of fixed-length pulses from the time-based generator circuit of FIG. 2. During this fixed-time period, the pulse counts (or oscillations cycles) with respect to oscillator 31, 32, and 33 are individually recorded in counter 34, 35, and 36. As stated above, for two oscillators loaded with two different values of capacitance, the ratio of the pulse counts from the oscillators will be inversely proportional to the ratio of the capacitors. With that, a digital measurement of parasitic capacitances C0 and C1 can be indirectly obtained from the pulse counts of the respective oscillators. In order to obtain an accurate measurement of parasitic capacitances C0 and C1, it is important that $C_{ref}$ is composed from a well characterized capacitance such as a MOSFET gate capacitor.

When measuring the total capacitance among three interconnects, one of the two interconnects must be grounded as shown in FIG. 1. After the capacitance between two interconnects and the total capacitance $C_T$ among the three interconnects have been determined by the method as outlined above, distance S between the two interconnects can be obtained by equation (5).

Figure 4:
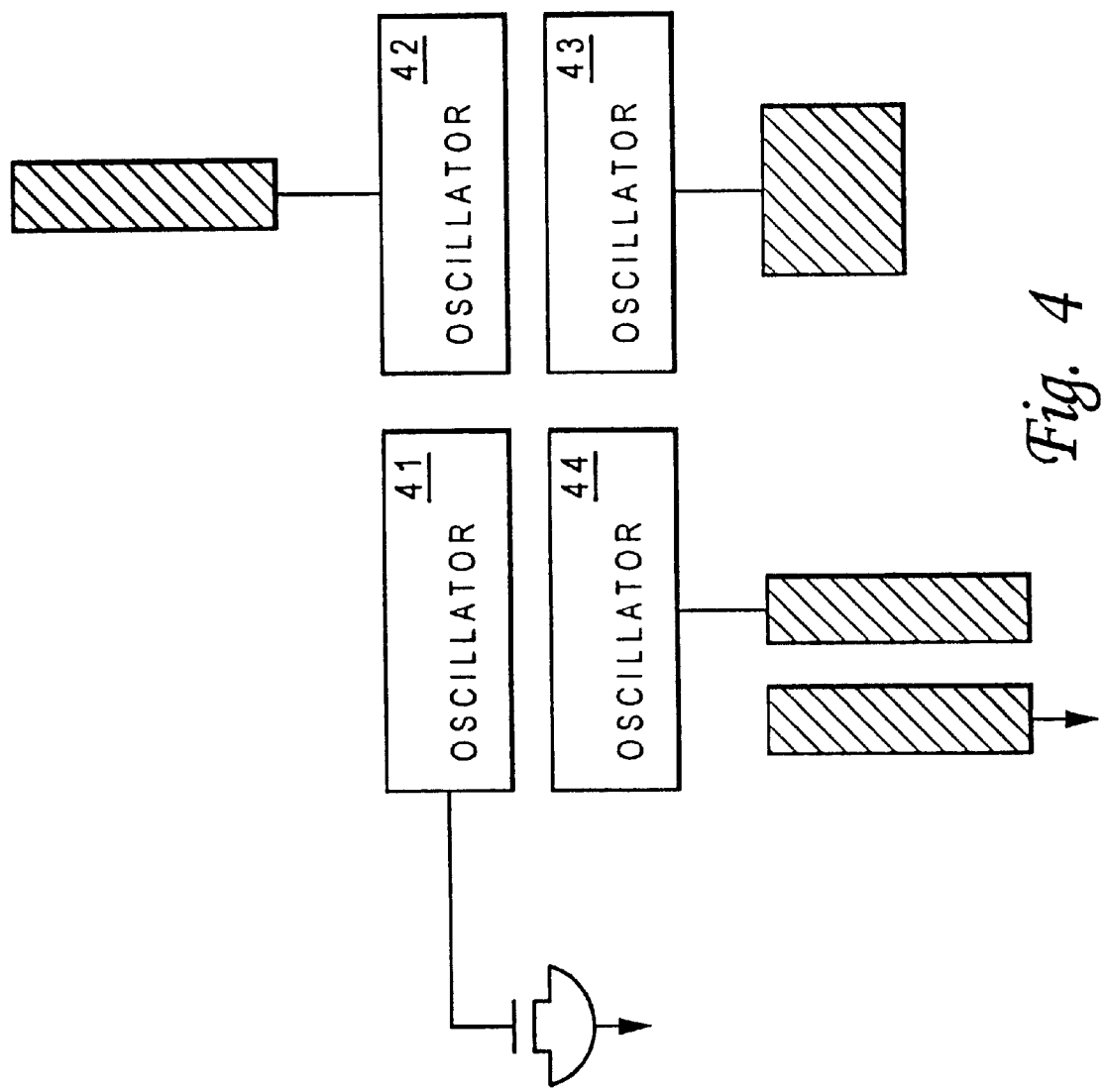
FIG. 4 is an example of a test structure layout in accordance with a preferred embodiment of the present invention.

With reference now to FIG. 4, there is graphically illustrated an example of a test structure layout in accordance with a preferred embodiment of the present invention. As shown, oscillator 41 is connected to a MOSFET gate utilized as a reference capacitor. Oscillators 42 and 43 are respectively connected to two single interconnects of different area/perimeters. Finally, oscillator 44 is connected to two interconnects in parallel with one interconnect grounded. By utilizing identical oscillators 41–44 as illustrated, the test structure is able to adapt to different processing environments by having the time interval track the frequency of the test oscillators. This also allows the test structure to be self-timed, thus making the test structure usable even under low frequency testers.

As has been described, the present invention provides an improved method and apparatus for characterizing dimensions and parasitic capacitance between IC interconnects. Under the present invention, a test structure is constructed for the rapid digital characterization of integrated-circuit interconnect geometries and of integrated-circuit interconnect parasitic capacitance without resolving to direct measurement.

While the invention has been particularly shown and described with reference to a preferred embodiment, it will be understood by those skilled in the art that various changes in form and detail may be made therein without departing from the spirit and scope of the invention.

What is claimed is:

1. A test structure for characterizing relative parasitic capacitances of a plurality of integrated-circuit interconnects, wherein said test structure is embedded within an integrated-circuit, said test structure comprising:

at least one oscillator connected to a plurality of integrated-circuit interconnects; and a counting mechanism, coupled to said at least one oscillator and to said plurality of integrated-circuit interconnects, that detects a ratio of oscillations on said plurality of integrated-circuit interconnects induced by said at least one oscillator such that relative parasitic capacitances of said plurality of integrated-circuit interconnects is determined.

2. The test structure according to claim 1, wherein one of said plurality of integrated-circuit interconnects is a reference capacitor.

3. The test structure according to claim 2, wherein said reference capacitor is a MOSFET gate.

4. The test structure according to claim 1, wherein said at least one oscillator is a ring oscillator.

5. The test structure according to claim 1, wherein said counting mechanism includes:

a pulse generator for generating a series of fixed-length clock pulses that gate detected oscillations on said plurality of integrated-circuit interconnects; and a plurality of substantially identical counters that are each coupled to a respective one of said plurality of integrated-circuit interconnects, and that are each utilized to measure a number of oscillations on said respective one of said plurality of integrated-circuit interconnects within a given number of said fixed-length clock pulses.

6. A method for characterizing relative parasitic capacitances of a plurality of integrated-circuit interconnects, wherein said test structure is embedded within an integrated-circuit, said method comprising the steps of:

connecting at least one oscillator to a plurality of integrated-circuit interconnects to be characterized; and detecting a ratio of oscillations on said plurality of integrated-circuit interconnects induced by said at least one oscillator such that relative parasitic capacitances of said plurality of integrated-circuit interconnects is determined.

7. The method according to claim 6, wherein one of said plurality of integrated-circuit interconnects is a reference capacitor.

8. The method according to claim 7, wherein one of said reference capacitors is a CMOS gate.

9. The method according to claim 6, wherein said at least one oscillator is a ring oscillator.

10. The method according to claim 6, wherein said injecting step is performed by a pulse generator.

11. The method according to claim 10, wherein said detecting step further includes:

generating a series of fixed-length clock pulses that gate detected oscillations on said plurality of integrated-circuit interconnects; and measuring a number of oscillations on each one of said plurality of integrated-circuit interconnects within a given number of said fixed-length clock pulses.

* * * * *